(12) United States Patent
Henle et al.

(10) Patent No.: US 7,948,115 B2
(45) Date of Patent: May 24, 2011

(54) CONTROLLER FOR A DOMESTIC APPLIANCE AND ASSOCIATED METHOD

(75) Inventors: Thomas Henle, Rangendingen (DE); Gottlieb Harald, Balingen (DE); Walter Beck, Albstadt (DE); Rolf Streifler, Weilen (DE)

(73) Assignee: E.G.O. Control Systems GmbH, Balingen (DE)

( * ) Notice: Subject to any disclaimer, the term of this patent is extended or adjusted under 35 U.S.C. 154(b) by 154 days.

(21) Appl. No.: 12/367,970

(22) Filed: Feb. 9, 2009

(65) Prior Publication Data

US 2009/0206816 A1 Aug. 20, 2009

(30) Foreign Application Priority Data

Feb. 19, 2008 (DE) .......................... 10 2008 011 495

(51) Int. Cl.
 *H02J 3/12* (2006.01)
(52) U.S. Cl. .......................................... 307/38; 307/12
(58) Field of Classification Search .................. 307/12, 307/38
 See application file for complete search history.

(56) References Cited

U.S. PATENT DOCUMENTS

| | | | | |
|---|---|---|---|---|
| 4,713,716 A | * | 12/1987 | Takemura et al. | 361/2 |
| 5,267,120 A | | 11/1993 | Graff et al. | |
| 5,455,733 A | * | 10/1995 | Waggamon | 361/115 |
| 5,568,025 A | * | 10/1996 | Sumida et al. | 318/287 |
| 6,304,189 B1 | | 10/2001 | Koch et al. | |
| 6,683,778 B2 | * | 1/2004 | Yugou | 361/179 |
| 6,703,842 B2 | * | 3/2004 | Itimura et al. | 324/544 |
| 7,038,895 B2 | * | 5/2006 | Imai et al. | 361/23 |
| 7,365,450 B2 | * | 4/2008 | Nagae et al. | 307/10.3 |
| 2008/0159759 A1 | * | 7/2008 | Park | 399/33 |

FOREIGN PATENT DOCUMENTS

| | | |
|---|---|---|
| CA | 1 263 144 | 11/1989 |
| DE | 197 33 533 A1 | 2/1999 |
| DE | 197 55 089 A1 | 6/1999 |
| DE | 10 2006 004 387 A1 | 8/2007 |
| DE | 10 2008 006 512 A1 | 7/2009 |
| EP | 0 924 331 A2 | 6/1999 |
| JP | 62-064291 | 3/1987 |
| WO | WO 00/31598 | 6/2000 |

OTHER PUBLICATIONS

Office Action for German Application No. 10 2008 011 495.2, Sep. 15, 2008.
European Search Report from European Application No. 09001573. 6, May 19, 2009.
Machine Translation of DE 10 2006 004 387 A1, Aug. 2, 2007.

\* cited by examiner

*Primary Examiner* — Jared J Fureman
*Assistant Examiner* — Adi Amrany
(74) *Attorney, Agent, or Firm* — Alston & Bird LLP

(57) ABSTRACT

A controller for functionally controlling a domestic appliance, such as a dryer, comprises a monitoring device that monitors the correct functioning of the domestic appliance. The domestic appliance has at least one monitoring connection connected to at least one associated evaluation node within a power circuit of the domestic appliance, and an evaluation device evaluates a signal produced at the at least one monitoring connection, for monitoring the correct functioning of the domestic appliance.

9 Claims, 1 Drawing Sheet

CONTROLLER FOR A DOMESTIC
APPLIANCE AND ASSOCIATED METHOD

CROSS REFERENCE TO RELATED
APPLICATIONS

This application claims priority to German Application Number 102008011495.2, filed on Feb. 19, 2008, the contents of which are incorporated by reference.

FIELD OF THE INVENTION

The invention relates to a controller for a domestic appliance, to a domestic appliance and to a method for monitoring for correct functioning of a domestic appliance.

BACKGROUND

Domestic appliances, for example tumble dryers, usually comprise electrical loads which are operated by mains AC voltage and have associated switching means, for example in the form of relays, with the switching means applying the mains AC voltage to the electrical loads or disconnecting the electrical loads from the mains AC voltage as a function of their switching state. The switching means are suitably actuated by a controller of the domestic appliance in order to ensure that the domestic appliance functions in the desired manner.

In order to ensure increased operational reliability of the domestic appliance and to prevent any possible danger to users, it is desirable to reliably and automatically identify a malfunction in the domestic appliance, for example, as a result of a defect in a switching means due to wear. When a malfunction is identified, the domestic appliance can be transferred to a safe state.

A method for operating a domestic appliance, in which method the domestic appliance is checked for malfunctions, is described in DE 10 2006 004 387 A1, for example.

BRIEF DESCRIPTION OF THE DRAWINGS

Advantageous embodiments of the invention will be described in the text which follows and are schematically illustrated in the drawing, in which.

DETAILED DESCRIPTION OF THE DRAWINGS

Figure 1:
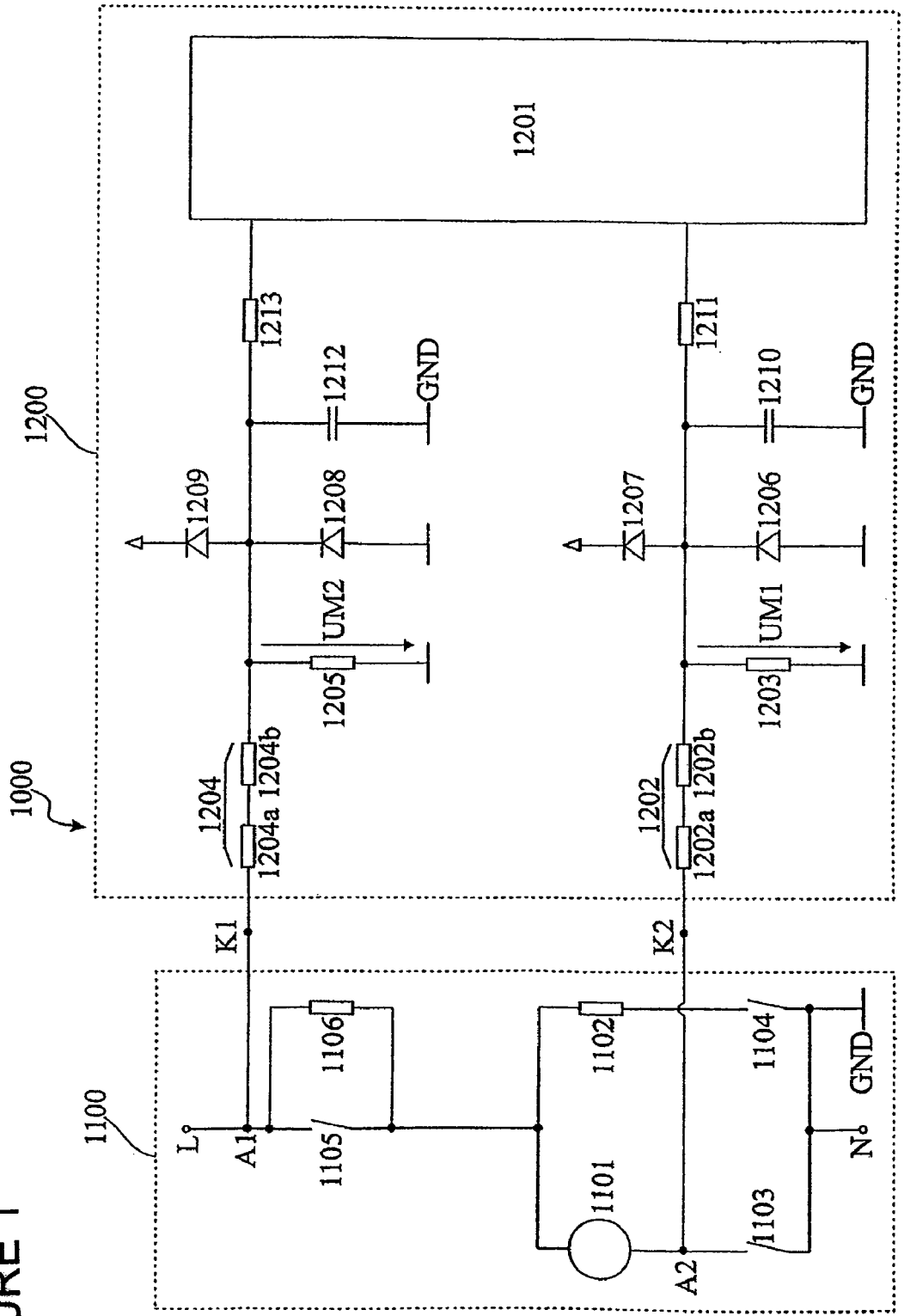
FIG. 1 illustrates a domestic appliance according to one embodiment of the invention comprising a controller for functional control and functional monitoring.

The invention is generally based on the object of providing a controller for a domestic appliance, a domestic appliance and a method for monitoring for correct functioning of a domestic appliance, said controller, domestic appliance or method increasing the operational reliability and it being possible to produce said controller and domestic appliance, and to implement said method, in a simple and cost-effective manner.

The invention achieves this object in one embodiment by virtue of a controller as claimed herein. Advantageous and preferred refinements of the invention are the subject matter of the further claims and will be explained in greater detail below. The wording of the claims is included in the description by way of express reference.

The controller according to one embodiment of the invention serves for functionally controlling a domestic appliance, in particular a tumble dryer. The domestic appliance comprises a power circuit having electrical loads which are operated by mains AC voltage, switching means which are actuated by the controller, with a single one of the switching means being associated with each load and connecting its associated load to one pole of the mains AC voltage or disconnecting its associated load from the pole of the mains AC voltage as a function of its switching state, and at least one central switching means which is actuated by the controller and connects all the loads to the other pole of the mains AC voltage or disconnects all the loads from the other pole of the mains AC voltage as a function of its switching state. The central switching means allows all the electrical loads to be collectively switched off. The switching means associated with the individual loads allow the associated load to be switched on and switched off individually. The controller comprises a monitoring device for monitoring for correct functioning of the domestic appliance. The monitoring device comprises at least one monitoring connection which is to be electrically connected to at least one associated evaluation node within the power circuit when the controller is installed in the domestic appliance, and an evaluation device which evaluates a signal, which is produced at the at least one monitoring connection, for monitoring for correct functioning of the domestic appliance. The controller can comprise a microprocessor, it being possible for the monitoring device and the evaluation device to be at least partially integrated in the microprocessor. In the context of monitoring for correct functioning of the domestic appliance, it is possible for the monitoring device to monitor, for example, whether the switching means are correctly opened and closed, whether the switching means are bridged or short-circuited, whether the electrical loads can be actuated, that is to say, for example, are bridged or short-circuited, etc.

In one embodiment of the controller, precisely one single monitoring connection is provided, which is to be connected to precisely one single associated evaluation node within the power circuit. The controller or the domestic appliance can be produced in a cost-effective manner on account of the low outlay on circuitry.

In another embodiment of the controller, the monitoring device comprises a first resistor and a second resistor which are configured in series between the monitoring connection and a reference potential of the monitoring device, in particular ground, with the evaluation device evaluating a signal, which is produced at a connection node of the first and of the second resistor, for monitoring for correct functioning of the domestic appliance. The first resistor and/or the second resistor can be formed by a parallel or series circuit of resistors.

In an alternative embodiment of the controller, precisely two monitoring connections are provided.

In one embodiment of the controller, one of the two monitoring connections is to be electrically connected to an associated evaluation node within the power circuit, which evaluation node is electrically connected to one pole of the mains AC voltage. The evaluation node can be electrically connected or coupled to the pole of the mains AC voltage directly, that is to say without interconnected components, or indirectly, that is to say with interconnected components. The pole of the mains AC voltage may be, for example, the neutral conductor or one of the external conductors of a three-phase or AC supply system. Electrically coupling a monitoring node to the mains AC voltage allows the phase angle of the mains AC voltage to be determined, it being possible for the signal at the other monitoring connection to be measured synchronously with a defined phase angle of the mains AC voltage. In this way, correct functioning of the domestic appliance can be more reliably monitored since the influence of the phase angle can be taken into account in the measurement operation.

In another embodiment of the controller, the monitoring device comprises a first resistor and a second resistor which are configured in series between a first of the two monitoring connections and a reference potential of the monitoring device, in particular ground, and also a third resistor and a fourth resistor which are configured in series between a second of the two monitoring connections and the reference potential, with the evaluation device evaluating a signal, which is produced at a connection node of the first and of the second resistor, and also evaluating a signal, which is produced at a connection node of the third and of the fourth resistor, for monitoring for correct functioning of the domestic appliance.

In another embodiment of the controller, the monitoring device has an analog/digital converter which digitizes the signal which is produced at the at least one monitoring connection, or a signal which is derived from said signal.

The domestic appliance, in particular a tumble dryer, according to one embodiment of the invention, comprises a power circuit having electrical loads which are operated by mains AC voltage, switching means which can be actuated, with a single one of the switching means being associated with each load and connecting its associated load to one pole of the mains AC voltage or disconnecting its associated load from the pole of the mains AC voltage as a function of its switching state, and at least one central switching means which can be actuated and connect all the loads to the other pole of the mains AC voltage or disconnect all the loads from the other pole of the mains AC voltage as a function of its switching state. The domestic appliance also comprises a controller according to the invention as described above.

In another embodiment of the domestic appliance, the switching means are relays.

In another embodiment of the domestic appliance, the loads comprise at least one motor and at least one electric heater.

In another embodiment of the domestic appliance, the central switching means is configured between one pole of the mains AC voltage and a first and a second load of the loads, a first switching means of the switching means is configured in between the first load and the other pole of the mains AC voltage, and a second switching means of the switching means is configured in between the second load and the other pole of the mains AC voltage, with the at least one monitoring connection of the monitoring device being alternately connected to a connection node of the first load and of the first switching means, to a connection node of the second load and of the second switching means, or to a connection node of the central switching means and of the first and the second load.

In another embodiment of the domestic appliance, precisely two monitoring connections are provided, with one of the two monitoring connections being connected to an associated evaluation node within the power circuit, which evaluation node is connected to one pole of the mains AC voltage.

The method according to one embodiment of the invention for monitoring for correct functioning of a domestic appliance as mentioned above comprises the steps of setting a defined switching position of the switching means, measuring the signal which is produced at the at least one monitoring connection, comparing the measured signal with a stored signal which is associated with the defined switching position, determining correct functioning of the domestic appliance when the measured signal corresponds to the stored signal, and determining incorrect functioning of the domestic appliance and actuating the switching means in such a way that a safest possible or most safe state of the domestic appliance is set, in particular all the switching means are opened, when the measured signal does not correspond to the stored signal.

In another embodiment of the method, two monitoring connections are provided, with one of the two monitoring connections being connected to an associated evaluation node within the power circuit, which evaluation node is connected to one pole of the mains AC voltage, with the phase angle of the mains AC voltage being determined by evaluating the signal at one monitoring connection, and the signal at the other monitoring connection being measured synchronously with a defined phase angle of the mains AC voltage, with correct functioning of the domestic appliance being determined as a function of the phase angle and the measured signal at one monitoring connection and the measured signal at the other monitoring connection, that is to say by evaluating the signals at the two monitoring connections.

These and further features may be gathered from the claims, but also from the description and the drawings, with the individual features being capable of being implemented in each case in themselves or severally in the form of subcombinations in an embodiment of the invention and in other fields and being capable of constituting advantageous and independently patentable versions for which protection is claimed here. The subdivision of the application into individual sections and intermediate headings does not restrict the general validity of the statements made under these.

When an element is said to be "connected" or "coupled" to another element, the elements can be connected or coupled to one another directly, that is to say without interconnected elements, or interconnected elements can be present. However, if an element is said to be "directly connected" or "directly coupled" to another element, no interconnected elements are present.

FIG. 1 shows a domestic appliance in the form of a tumble dryer 1000 having a power circuit 1100 and a controller 1200 for functionally controlling the tumble dryer 1000.

The power circuit 1100 comprises electrical loads, which are operated by mains AC voltage, in the form of a motor 1101 and an electric heater 1102, switching means, which can be actuated, in the form of relays 1103 and 1104, with a single one of the relays 1103 and 1104 being associated with each of the loads 1101 and 1102 and connecting its associated load to one pole N of the mains AC voltage or disconnecting its associated load from the pole N of the mains AC voltage as a function of its switching state, and at least one central switching means in the form of a relay 1105 which can be actuated and connects all the loads 1101 and 1102 to the other pole L of the mains AC voltage or disconnects all the loads from the other pole L of the mains AC voltage as a function of its switching state. A highly resistive coupling resistor 1106 is connected in parallel with the central relay 1105.

In the power circuit 1100, the central switching means or relay 1105 is configured in between the pole L of the mains AC voltage, in the present case an external conductor of a three-phase supply system, and the loads 1101 and 1102, the relay 1103 is looped in between the motor 1101 and the other pole N of the mains AC voltage, and the relay 1104 is configured in between the electric heater 1102 and the other pole N of the mains AC voltage, with an evaluation node A1 being formed by the pole L of the mains AC voltage, and an evaluation node A2 being formed by a connection node of the motor 1101 and the associated relay 1103.

The controller 1200 serves, inter alia, to actuate the relays 1103, 1104 and 1105 and to monitor for correct functioning of the domestic appliance 1000. In the context of monitoring for correct functioning of the domestic appliance 1000, it is possible for the monitoring device to monitor, for example, whether the relays 1103, 1104 and 1105 are opened and closed correctly, that is to say as actuated, whether the relays are bridged or short-circuited, whether the electrical loads 1101 and 1102 can be actuated, that is to say, for example, are bridged or short-circuited, and/or whether faults are present within the controller.

In order to monitor for correct functioning of the domestic appliance 1000, the controller 1200 comprises a monitoring device having two monitoring connections K1 and K2, with the monitoring connection K1 being electrically connected to the evaluation node A1 of the power circuit 1100, and the monitoring connection K2 being electrically connected to the evaluation node A2 of the power circuit 1100. The monitoring device also comprises an evaluation device in the form of a microprocessor 1201, with the microprocessor 1201 evaluating the signals which are produced at the monitoring connections K1 and K2 or signals UM1 and UM2, which are derived from said signals which are produced at the monitoring connections, for monitoring for correct functioning of the domestic appliance 1000.

In order to condition the signals which are produced at the monitoring connections K1 and K2, the monitoring device 1200 also comprises a first resistor 1202, comprising component resistors 1202a and 1202b which are connected in series, and a second resistor 1203, with the resistors 1202 and 1203 being configured in series between the monitoring connection K2 and ground GND. A third resistor 1204, comprising component resistors 1204a and 1204b which are connected in series, and a fourth resistor 1205 are configured in series between the monitoring connection K1 and ground GND.

A first input of the microprocessor 1201 is connected to a connection node of the first and of the second resistor 1202 and 1203, and a second input of the microprocessor 1201 is connected to a connection node of the third and of the fourth resistor 1204 and 1205, with an analog/digital converter (not shown) of the microprocessor 1201 digitizing the signals UM1 and, respectively, UM2 which are produced at the respective connection nodes. The microprocessor 1201 evaluates the digitized signals for monitoring for correct functioning of the domestic appliance 1000. Diodes 1206 and 1207 and also 1208 and 1209 serve as clamping diodes for overvoltage protection of the associated inputs of the microprocessor 1201. Optional capacitors 1210 and 1212 and also optional resistors 1211 and 1213 serve as filters and protection means for the associated inputs of the microprocessor 1201.

For functional monitoring purposes, the monitoring device or its microprocessor 1201 first actuates the relays 1103, 1104 and 1105 in such a way that all the relays 1103, 1104 and 1105 are in a defined switching position. A defined switching position of this kind can comprise a state in which all the relays 1103, 1104 and 1105 are open. The phase angle of the mains AC voltage is then determined by evaluating the signal at the monitoring connection K1. For example, a maximum of a positive half-wave of the mains AC voltage can be determined by the signal UM2 being sampled, with the maximum being present when the signal UM2 can not increase any further. When the maximum is detected, the signal UM1 can immediately subsequently be read in and digitized, that is to say the signal UM1 is measured synchronously with a defined phase angle of the mains AC voltage.

When all the relays 1103, 1104 and 1105 are open and there are no faults in the controller 1200 either, the measured or sampled values of the signals UM1 and UM2 have to have values which are already known and are stored in the microprocessor. Given correct functioning, the voltage UM2 set in the present case is a periodic voltage which is proportional to the mains voltage at a positive half-wave of the mains voltage and which corresponds approximately to the ground voltage at a negative half-wave of the mains voltage on account of the clamping action of the diode 1208. The qualitative characteristic of the voltage UM 1 corresponds to the voltage UM2, with the ratio between the voltages UM1 and UM2 being defined by the value of the resistors 1202, 1203, 1204, 1205 and 1106. In particular, the synchronized, measurement of the voltage UM1 alone, the measurement of the two voltages UM1 and UM2 and/or the calculation of the ratio of the voltages UM1 and UM2 can accordingly be used as a plausibility check for the functional test. The synchronized measurement of the voltage UM1 permits compensation of interference effects which can occur when a mains plug of the domestic appliance is inserted with reversed polarity, that is to say when the poles N and L of the mains voltage are switched over in comparison to the manner illustrated in FIG. 1.

When the sample values correspond to the stored values, the conclusion can be drawn that the domestic appliance 1000 is functioning correctly. Otherwise, the conclusion can be drawn that the domestic appliance 1000 is not functioning correctly, as a result of which the relays remain open.

Checking can be continued by changing the switching states of the relays 1103, 1104 and 1105 and the signals UM1 and UM2 again being evaluated in the manner described above. The signal UM1 can be read in at a maximum of the positive half-wave of the mains AC voltage but, in addition or as an alternative, also during a negative half-wave of the mains AC voltage and/or at a positive or negative zero crossing of the mains AC voltage.

As an alternative to the embodiment illustrated in FIG. 1, the upper evaluation branch comprising the monitoring connection K1, the resistors 1204, 1205 and 1213, the diodes 1208 and 1209 and also the capacitor 1212 can be dispensed with. The voltage UM1 is then not measured synchronously with the mains voltage. However, it is also necessary, in this case, for defined switching states of the relays 1103, 1104 and 1105 to produce defined characteristics or values of the voltage UM1, with the precondition that there are no functional faults.

The other electrical loads and associated switching means which are connected in series with said electrical loads can be connected in parallel with the loads 1101 and 1102 and their associated switching means 1103 and, respectively, 1104 in a corresponding manner.

As an alternative, the evaluation node can also be formed by a connection node of the second load 1102 and the associated switching means 1104 or by a connection node of the two loads 1101 and 1102 and also of the central switching means 1105.

The invention claimed is:

1. A controller controlling a domestic appliance, said domestic appliance comprising a power circuit having:
   1) electrical loads which are operated by a mains AC voltage,
   2) switching means which are configured to be actuated by the controller, wherein each electrical load is associated with a corresponding one of the switching means configured to either connect or disconnect its respective electrical load to one pole of the mains AC voltage as a function of a switching state of the switching means,
   3) at least one central switching means configured to be actuated by the controller to connect or disconnect all the electrical loads to another pole of the mains AC voltage as a function of the switching state of said central switching means, and 4) a first evaluation node and a second evaluation node, said first evaluation node connected to said another pole of the mains AC voltage;

said controller comprising:

a monitoring device comprising:

a first monitoring connection connected to the first evaluation node and a second monitoring connection connected to the second evaluation node; and an evaluation device adapted to determine the phase angle of the mains AC voltage by evaluating a first signal at the first monitoring connection, said evaluation device adapted to measure a second signal at the second monitoring connection synchronously with a defined phase angle of the mains AC voltage, and adapted to determine the correct functioning of the domestic appliance as a function of said defined phase angle and the measured second signal at the second monitoring connection.

2. The controller of claim 1, wherein the monitoring device further comprises a first resistor and a second resistor coupled in series between said first monitoring connection and a ground reference potential of the monitoring device, wherein the evaluation device evaluates a third signal produced at a connection node of the first and of the second resistor, for determining correct functioning of the domestic appliance.

3. The controller of claim 1, wherein the monitoring device further comprises:

a first resistor and a second resistor coupled in series between said first monitoring connection and a ground reference potential of the monitoring device, and a third resistor and a fourth resistor coupled in series between said second monitoring connection and the ground reference potential, wherein the evaluation device is configured to evaluate 1) a third signal produced at a connection node of the first and of the second resistor, and 2) a fourth signal produced at a connection node of the third and of the fourth resistor, for determining correct functioning of the domestic appliance.

4. The controller of claim 1, wherein the monitoring device has an analog-to-digital converter configured to digitize the signal produced at the first monitoring connection.

5. A domestic appliance, comprising:

a power circuit comprising:

1) electrical loads operated by a mains AC voltage, 2) actuatable switching means, wherein each load is associated with a corresponding one of the switching means configured to connect or disconnect its associated load to one pole of the mains AC voltage as a function of a switching state of said switching means, 3) at least one actuatable central switching means connecting all the loads to another pole (L) of the mains AC voltage or disconnecting all the loads from said another pole (L) of the mains AC voltage as a function of the switching state, and 4) a first evaluation node and a second evaluation node, said first evaluation node connected to said another pole (L) of the mains AC voltage; and a controller comprising a monitoring device monitoring for correct functioning of the domestic appliance, wherein said monitoring device comprises:

a first monitoring connection connected to the first evaluation node and a second monitoring connection connected to the second evaluation node, and an evaluation device adapted to determine the phase angle of the mains AC voltage by evaluating a first signal at the first monitoring connection, adapted to measure a second signal at the second monitoring connection synchronously with a defined phase angle of the mains AC voltage, and adapted to determine the correct functioning of the domestic appliance as a function of said defined phase angle and the measured second signal at the second monitoring connection.

6. The domestic appliance of claim 5, wherein the switching means are relays.

7. The domestic appliance of claim 5, wherein the electrical loads comprise an electric motor and an electric heater.

8. The domestic appliance of claim 5, wherein the central switching means is configured inbetween said another pole (L) of the mains AC voltage and a first and a second load of the loads, a first switching means of the switching means is configured inbetween the first load and said one pole (N) of the mains AC voltage, and a second switching means of the switching means is configured inbetween the second load and said one pole (N) of the mains AC voltage, with the second monitoring connection connected to one of a connection node of the first load and of the first switching means or to a connection node of the second load and of the second switching means.

9. A method of operating a domestic appliance, wherein said appliance comprises:

a power circuit comprising:

1) electrical loads operated by a mains AC voltage, 2) actuatable switching means, wherein each load is associated with a corresponding one of the switching means configured to connect or disconnect its associated load to one pole of the mains AC voltage as a function of a switching state of said switching means, 3) at least one actuatable central switching means connecting all the loads to another pole (L) of the mains AC voltage or disconnects all the loads from said another pole (L) of the mains AC voltage as a function of the switching state, and 4) a first evaluation node and a second evaluation node, said first evaluation node connected to said another pole (L) of the mains AC voltage;

said method comprising the steps of:

setting a defined switching position of the switching means, determining the phase angle of the mains AC voltage by evaluating a first signal at the first evaluation node, measuring a second signal at the second evaluation node synchronously with a defined phase angle of the mains AC voltage, and determining the correct functioning of the domestic appliance as a function of said defined phase angle and the measured second signal at the second evaluation node.

* * * * *